US008816336B2

(12) United States Patent
Shimomura

(10) Patent No.: US 8,816,336 B2
(45) Date of Patent: Aug. 26, 2014

(54) SEALED BODY, METHOD FOR MANUFACTURING SEALED BODY, LIGHT-EMITTING DEVICE, AND METHOD FOR MANUFACTURING LIGHT-EMITTING DEVICE

(75) Inventor: Akihisa Shimomura, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 203 days.

(21) Appl. No.: 13/523,435

(22) Filed: Jun. 14, 2012

(65) Prior Publication Data
US 2012/0319092 A1 Dec. 20, 2012

(30) Foreign Application Priority Data

Jun. 16, 2011 (JP) .................................. 2011-133957

(51) Int. Cl.
*H01L 29/08* (2006.01)

(52) U.S. Cl.
USPC ..................................... 257/40; 257/E51.018

(58) Field of Classification Search
CPC ............................ H01L 51/5246; B32B 37/06
USPC ............................................ 257/40, E51.018
See application file for complete search history.

(56) References Cited

U.S. PATENT DOCUMENTS

| 6,113,450 | A | 9/2000 | Narayanan et al. |
| 6,646,284 | B2 | 11/2003 | Yamazaki et al. |
| 6,803,246 | B2 | 10/2004 | Yamazaki et al. |
| 6,860,780 | B2 | 3/2005 | Miyashita et al. |
| 6,984,159 | B1 | 1/2006 | Kado et al. |
| 6,998,776 | B2 | 2/2006 | Aitken et al. |
| 7,121,642 | B2 | 10/2006 | Stoessel et al. |
| 7,407,423 | B2 | 8/2008 | Aitken et al. |
| 7,431,628 | B2 | 10/2008 | Park et al. |
| 7,602,121 | B2 | 10/2009 | Aitken et al. |
| 7,701,136 | B2 | 4/2010 | Kwak |
| 7,780,493 | B2 | 8/2010 | Choi et al. |
| 7,837,530 | B2 | 11/2010 | Park |
| 7,868,540 | B2 | 1/2011 | Kim |
| 7,871,949 | B2 | 1/2011 | Lee et al. |
| 7,944,143 | B2 | 5/2011 | Choi et al. |
| 8,063,560 | B2 | 11/2011 | Aitken et al. |
| 8,125,146 | B2 | 2/2012 | Park |
| 8,164,257 | B2 | 4/2012 | Choi et al. |
| 8,400,057 | B2* | 3/2013 | Kwon et al. ................... 313/512 |

(Continued)

FOREIGN PATENT DOCUMENTS

| JP | 5-208852 | 8/1993 |
| JP | 2011-65895 | 3/2011 |
| JP | 2011-70797 | 4/2011 |

*Primary Examiner* — Trung Q Dang
(74) *Attorney, Agent, or Firm* — Husch Blackwell LLP

(57) ABSTRACT

A highly productive method for sealing substrates with the use of glass frit is provided. A method for sealing substrates with the use of glass frit, which can be used for a substrate provided with a material having low heat resistance, is provided. A highly airtight sealed body which is manufactured by such a method is provided. A light-emitting device having high productivity and high reliability and a manufacturing method thereof are provided. A heat generation layer containing a conductive material which generates heat by induction heating is formed to overlap with a region where a paste including a frit material and a binder is applied. Alternatively, a conductive material which generates heat by induction heating is added to the paste itself. The paste is locally heated by induction heating to remove the binder included in the paste.

22 Claims, 8 Drawing Sheets

(56) References Cited

U.S. PATENT DOCUMENTS

| | | |
|---|---|---|
| 8,461,575 B2 * | 6/2013 | Oh et al. .......................... 257/40 |
| 8,674,601 B2 * | 3/2014 | Lee ................................ 313/512 |
| 2007/0170854 A1 | 7/2007 | Kwak |
| 2007/0232182 A1 | 10/2007 | Park |
| 2009/0058292 A1 | 3/2009 | Koo et al. |
| 2012/0056523 A1 * | 3/2012 | Han et al. ...................... 313/243 |
| 2012/0285200 A1 | 11/2012 | Tanaka |
| 2012/0318023 A1 | 12/2012 | Shimomura |
| 2013/0174608 A1 * | 7/2013 | Takeuchi et al. .................. 65/40 |

* cited by examiner

SEALED BODY, METHOD FOR MANUFACTURING SEALED BODY, LIGHT-EMITTING DEVICE, AND METHOD FOR MANUFACTURING LIGHT-EMITTING DEVICE

BACKGROUND OF THE INVENTION

1. Field of the Invention

The present invention relates to a sealed body including two substrates and a method for manufacturing the sealed body. Further, the present invention relates to a light-emitting device including an organic EL element and a method for manufacturing the light-emitting device.

2. Description of the Related Art

A technique in which a highly airtight sealed body is formed in such a manner that two substrates are bonded to each other by glass frit (also referred to as frit glass) including low-melting glass is known. In a technique disclosed in Patent Document 1, a paste containing a binder and a frit material including low-melting glass is applied to a glass substrate along an edge of the glass substrate, the binder is removed and the frit material is melted to form glass frit by baking of the paste, the glass frit is irradiated with laser light with the substrate overlapping with a counter substrate, and the glass frit is melted so that the substrate and the counter substrate are bonded to each other by the glass frit; thus, a highly airtight sealed body is formed.

Since glass frit has a high gas barrier property, a space sealed with the glass frit can be kept away from the external atmosphere. A method for sealing with such glass fit is used for a device including an element, such as an organic EL element, whose performance is rapidly decreased once the element is exposed to air (including moisture, oxygen, or the like).

As examples of the device including the organic EL element, a lighting device, an image display device in which a thin film transistor and an organic EL element are combined, and the like can be given. Since the organic EL element can be formed into a film and a large-area organic EL element can be easily formed, a lighting device including a planar light source can be provided using the organic EL element. Further, since a backlight is not needed for an image display device including the organic EL element, the image display device can be thin and light weight, and have high contrast.

REFERENCE

Patent Document

[Patent Document 1] Japanese Published Patent Application No. 2011-65895

SUMMARY OF THE INVENTION

As described above, in the method for sealing with the glass frit, the paste including the fit material and the binder needs to be baked for removing the binder after the paste is applied to the substrate. The binder is removed, so that the glass frit after being irradiated with laser light can have a high gas barrier property. Although baking temperature depends on the material, baking at a high temperature of approximately 350° C. to 450° C. generally needs to be performed for removing the binder completely.

In general, a heating apparatus such as an oven or an annealing furnace is used for baking a paste. However, such a heating apparatus is large in size and it takes a long time to reach desired baking temperature due to heat capacity of a substrate. Accordingly, productivity is greatly affected by a long process time in a step of baking the paste, high initial cost and running cost of the heating apparatus, and the like.

A substrate to which a paste is applied cannot be baked at high temperature in some cases. For example, in the case where an organic substance with low heat resistance is formed over a substrate, heat treatment at high temperature cannot be performed on the substrate after a paste is applied to the substrate. In the case of an organic EL device, a color filter, an optical adjustment layer for improving light extraction efficiency, such as a micro lens array, and the like can be given as examples of an element with low heat resistance formed over a substrate.

The present invention is made in view of the foregoing technical background. Therefore, an object of an embodiment of the present invention is to provide a highly productive method for sealing substrates with glass frit. Further, an object is to provide a method for sealing substrates with glass frit, which can also be used for a substrate for which a material with low heat resistance is provided. Further, an object is to provide a highly airtight sealed body which is manufactured by either of the above methods. Further, an object is to provide a light-emitting device with high productivity and high reliability and a method for manufacturing the light-emitting device.

An embodiment of the present invention achieves at least one of the above objects.

In order to achieve the above objects, the present invention focuses on baking by locally heating a region to which a paste including a frit material and a binder is applied after the paste is applied to a substrate. A heat generation layer containing a conductive material which generates heat by induction heating is formed to overlap with the region to which the paste is applied. Alternatively, a conductive material which generates heat by induction heating is added to the paste itself. By the above methods, the region to which the paste is applied or the paste itself can be locally heated.

An induction heating method is a method by which an object to be, heated is heated in a non-contacting manner utilizing an electromagnetic induction phenomenon. For example, when a conductive object to be heated is located within a magnetic field created by a coil connected to an alternating-current power source, eddy current is generated within the object to be heated due to change in the magnetic field created by the coil, and the object to be heated itself can be heated by Joule heat of the current without any contact.

By such an induction heating method, a conductive object to be heated itself can be heated. Therefore, with the use of the induction heating method, heat treatment can be performed quickly regardless of heat capacity of a substrate to which a paste is applied; thus, time for performing baking treatment can be greatly reduced. Further, since induction heating can be performed with a device having a simple structure, the structure of the device used in the induction heating can be simpler than that used in a heating method using an oven or an annealing furnace, and productivity can be increased.

Further, the paste is locally baked by such an induction heating method, so that a region where the paste is not provided is hardly affected. Accordingly, even in the case where a material with low heat resistance is provided over a substrate, a paste can be baked without thermal effect on such a material.

In other words, an embodiment of the present invention is a method for manufacturing a sealed body, including the steps of forming a heat generation layer over a first substrate; forming a frit paste including a frit material and a binder over the heat generation layer; heating the heat generation layer by induction heating to remove the binder and to fuse the frit material so that glass frit is formed; arranging the first substrate and a second substrate so that the first substrate and the second substrate face each other and that the glass frit and the second substrate are closely attached to each other; and irradiating the glass frit with laser light to bond the glass frit to the second substrate, so that a closed space surrounded by the first substrate, the second substrate, the glass frit, and the heat generation layer is formed. The frit paste has a shape of a closed curve.

An embodiment of the present invention is a method for manufacturing a sealed body, including the steps of forming a frit paste including a frit material, a binder, and a conductive material over a first substrate; heating the frit paste by induction heating to remove the binder and to fuse the frit material so that glass frit is formed; arranging the first substrate and a second substrate so that the first substrate and the second substrate face each other and that the glass frit and the second substrate are closely attached to each other; and irradiating the glass frit with laser light to bond the glass frit to the second substrate, so that a closed space surrounded by the first substrate, the second substrate, and the glass frit is formed. The frit paste has a shape of a closed curve.

In the above method, a paste including a material generating heat by induction heating is used, whereby a step of forming a heat generation layer can be omitted, resulting in improvement of productivity.

Further, an embodiment of the present invention is a sealed body including a first substrate, a second substrate, and glass frit including a conductive material. A closed space surrounded by the first substrate, the second substrate, and the glass frit is formed.

When a sealed body is formed by either of the above manufacturing methods, the sealed body can have high productivity and high airtightness.

Further, an embodiment of the present invention is a method for manufacturing a light-emitting device, including the steps of forming a heat generation layer over a surface of a first substrate; forming a frit paste including a frit material and a binder over the heat generation layer; heating the heat generation layer by induction heating to remove the binder and to fuse the frit material so that glass frit is formed; forming a light-emitting unit including an EL element over a surface of a second substrate; arranging the first substrate and the second substrate so that the first substrate and the second substrate face each other and that the glass frit and the second substrate are closely attached to each other; and irradiating the glass frit with laser light to bond the glass frit to the second substrate, so that a closed space which is surrounded by the first substrate, the second substrate, the glass frit, and the heat generation layer and in which the light-emitting unit is enclosed is formed. The frit paste has a shape of a closed curve.

Further, an embodiment of the present invention is a method for manufacturing a light-emitting device, including the steps of forming a frit paste including a frit material, a binder, and a conductive material over a surface of a first substrate; heating the frit paste by induction heating to remove the binder and to fuse the frit material so that glass frit is formed; forming a light-emitting unit including an EL element over a surface of a second substrate; arranging the first substrate and the second substrate so that the first substrate and the second substrate face each other and that the glass frit and the second substrate are closely attached to each other; and irradiating the glass frit with laser light to bond the glass frit to the second substrate, so that a closed space which is surrounded by the first substrate, the second substrate, and the glass frit and in which the light-emitting unit is enclosed is formed. The frit paste has a shape of a closed curve.

An embodiment of the present invention is a light-emitting device including a first substrate, a second substrate provided with a light-emitting unit, and glass frit including a conductive material. A closed space which is surrounded by the first substrate, the second substrate, and the glass frit and in which the light-emitting unit is enclosed is formed.

As described above, the sealed body and the method for manufacturing the sealed body according to embodiments of the present invention can be used for a light-emitting device including a light-emitting unit. Thus, a light-emitting device with high productivity and high reliability can be manufactured.

Further, an embodiment of the present invention is a method for manufacturing a light-emitting device, including the steps of forming a heat generation layer over a surface of a first substrate; forming a color filter in a region which does not overlap with the heat generation layer over the surface of the first substrate; forming a frit paste including a frit material and a binder over the heat generation layer; heating the heat generation layer by induction heating to remove the binder and to fuse the frit material so that glass frit is formed; forming a light-emitting unit including an EL element over a surface of a second substrate; arranging the first substrate and the second substrate so that the color filter and the light-emitting unit face each other and that the glass frit and the second substrate are closely attached to each other; and irradiating the glass frit with laser light to bond the glass frit to the second substrate, so that a closed space which is surrounded by the first substrate, the second substrate, the glass frit, and the heat generation layer and in which the light-emitting unit and the color filter are enclosed is formed. The frit paste has a shape of a closed curve and surrounds the color filter.

Further, an embodiment of the present invention is a method for manufacturing a light-emitting device, including the steps of forming a color filter over a surface of a first substrate; forming a frit paste including a fit material, a binder, and a conductive material over the surface of the first substrate; heating the frit paste by induction heating to remove the binder and to fuse the frit material so that glass frit is formed; fuming a light-emitting unit including an EL element over a surface of a second substrate; arranging the first substrate and the second substrate so that the color filter and the light-emitting unit face each other and that the glass frit and the second substrate are closely attached to each other; and irradiating the glass frit with laser light to bond the glass frit to the second substrate, so that a closed space which is surrounded by the first substrate, the second substrate, and the glass frit and in which the light-emitting unit and the color filter are enclosed is formed. The frit paste has a shape of a closed curve and surrounds the color filter.

In an embodiment of the present invention, particularly in the case where a sealing method using glass fit is used for a top-emission display device including a color filter, the paste needs to be applied to either a substrate for which an organic EL element is provided or a counter substrate for which a color filter is provided and to be baked. However, since the organic EL element and the color filter have low heat resistance, baking cannot be performed.

Alternatively, a color filter may be formed after baking of the paste. In the case of a high-definition display device, the color filter is generally filmed by a photolithography method; therefore, the color filter might not be evenly formed at an end portion of the glass frit in the step of forming a film of the color filter.

Therefore, with the use of a method for baking a paste by induction heating according to an embodiment of the present invention, a highly reliable display device including a color filter can be manufactured.

An embodiment of the present invention is a light-emitting device including a first substrate provided with a color filter; a second substrate provided with a light-emitting unit; and glass frit including a conductive material. A closed space which is surrounded by the first substrate, the second substrate, and the glass frit and in which the color filter and the light-emitting unit facing each other are enclosed is formed.

By any of the above methods, a highly reliable light-emitting device can be manufactured. Further, a highly reliable light-emitting device including a color filter can be manufactured.

Note that a "closed curve" in this specification and the like means a continuous curve with no endpoints. Further, here, a "curve" includes concepts of a straight line and a line segment in its broad sense. Therefore, the case where a plurality of line segments is included and every end point of the line segments overlaps with another end point, such as a periphery of a quadrangle, is also one mode of the closed curve. Further, a polygon, a circle, an ellipse, a shape in which a plurality of curves having different curvatures is continuously connected, a shape including a straight line and a curve, or the like is also one mode of the closed curve.

Note that in this specification and the like, the term EL layer refers to a layer provided between a pair of electrodes of a light-emitting element and including at least a layer including a light-emitting organic compound (also referred to as a light-emitting layer), or a stack including the light-emitting layer.

Note that a light-emitting device in this specification refers to a device including an image display device, a light-emitting unit, or a light source. Therefore, a display device including an image display device, a lighting device including a light-emitting unit or a light source, or the like is an embodiment of the light-emitting device. In addition, the light-emitting device includes any of the following modules in its category: a module in which a connector such as a flexible printed circuit (FPC), a tape automated bonding (TAB) tape, or a tape carrier package (TCP) is attached to a light-emitting device; a module having a TAB tape or a TCP provided with a printed wiring board at the end thereof; and a module having an integrated circuit (IC) directly mounted over a substrate over which a light-emitting element is formed by a chip on glass (COG) method.

According to an embodiment of the present invention, a highly productive method for sealing substrates with glass frit can be provided. Further, a method for sealing substrates with glass frit, which can be used for a substrate provided with a material with low heat resistance, can be provided. Further, a highly airtight sealed body manufactured in either method can be provided. A light-emitting device with high productivity and high reliability and a manufacturing method thereof can be provided.

DETAILED DESCRIPTION OF THE INVENTION

Figure 1A:
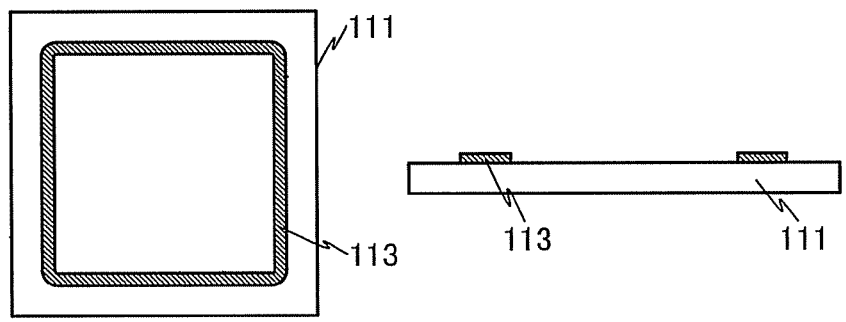
FIGS. 1A to 1D illustrate a method for manufacturing a sealed body, according to an embodiment of the present invention.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Note that in each drawing referred to in this specification, the size, the layer thickness, or the region of each component is exaggerated for clarity in some cases. Therefore, embodiments of the present invention are not limited to such scales.

(Embodiment 1)

In this embodiment, a method for manufacturing a sealed body, according to an embodiment of the present invention, will be described with reference to FIGS. 1A to 1D, FIGS. 2A and 2B, and FIGS. 3A to 3E.

MANUFACTURING METHOD EXAMPLE 1

FIGS. 1A to 1D and FIGS. 2A and 2B illustrate a method for manufacturing a sealed body described in this manufacturing method example. In each of FIGS. 1A to 1D and FIGS. 2A and 2B, a schematic top view and a corresponding schematic cross-sectional view are illustrated.

First, a heat generation layer 113 is formed over a first substrate 111 (see FIG. 1A). The heat generation layer 113 includes a conductive material which can generate heat in later induction heating treatment. The heat generation layer 113 includes a material which generates heat enough to heat a frit paste 115 formed over the heat generation layer 113 so that a binder in the frit paste 115 is removed and a frit material in the frit paste 115 is melted. Note that a material which can withstand at least temperature at which the binder contained in the frit paste 115 is removed is used for the heat generation layer 113.

As a material which can generate heat by induction heating, at least a conductive material can be given. For example, a metal material can be used. It is preferable to use a conductive material having relatively high resistance because heat can be efficiently generated by induction heating. For example, iron, tungsten, molybdenum, stainless steel, an alloy containing any of them, or the like can be given. The heat generation layer 113 may be a stack including films including the above materials.

As described later, in an induction heating method, a portion closer to a surface of a conductor generates a larger amount of heat, and transmission of electromagnetic waves inside the conductor depends on frequency used, physical properties of the conductor (e.g., electric conductivity and magnetic permeability), or the like. Therefore, the thickness of the heat generation layer 113 is set as appropriate in accordance with the material of the heat generation layer 113 and the frequency used in induction heating performed later. The thickness of the heat generation layer 113 is preferably greater than or equal to 0.5 µm and less than or equal to 100 µm.

The heat generation layer 113 can be formed in such a manner that a conductive film is formed over the first substrate 111 by a deposition method such as a sputtering method or a CVD method and then an unnecessary region of the conductive film is removed by a patterning technique such as a photolithography method. However, the method for forming the heat generation layer 113 is not limited thereto. The heat generation layer 113 may be formed by a plating method, a printing method such as a screen printing method, or a discharging method such as an inkjet method. The heat generation layer 113 is preferably formed to have a shape of a closed curve, which is approximately the same pattern as the pattern of the frit paste 115 formed later, along an outer periphery of the first substrate 111. The heat generation layer 113 is not necessarily formed to have a shape of a closed curve, and may include one or more of island-shaped patterns to be overlapped by the frit paste 115 formed later.

Figure 1B:
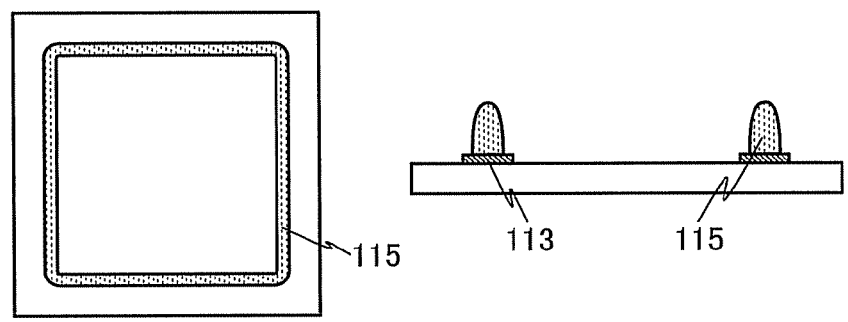

Next, the frit paste 115 is formed over the heat generation layer 113 (see FIG. 1B). The frit paste 115 includes the frit material formed of powder glass and the binder, and can be formed by a printing method such as a screen printing method, a dispensing method, or the like. The frit paste 115 is formed to have a shape of a closed curve along the outer periphery of the first substrate 111.

It is preferable that the frit material include one or more compounds selected from a group of, for example, magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, antimony oxide, lead borate glass, tin phosphate glass, vanadate glass, and borosilicate glass. For example, a binder formed using a resin diluted with an organic solvent is mixed with the frit material; thus, the frit paste is formed.

A buffer layer for improving adhesion between the heat generation layer 113 and glass frit 119 formed later may be foamed between the heat generation layer 113 and the frit paste 115. The buffer layer can be formed using an insulator having high heat resistance, such as an oxide or a nitride. For example, a silicon oxide film, a silicon nitride film, an aluminum oxide film, or the like can be used.

Figure 1C:
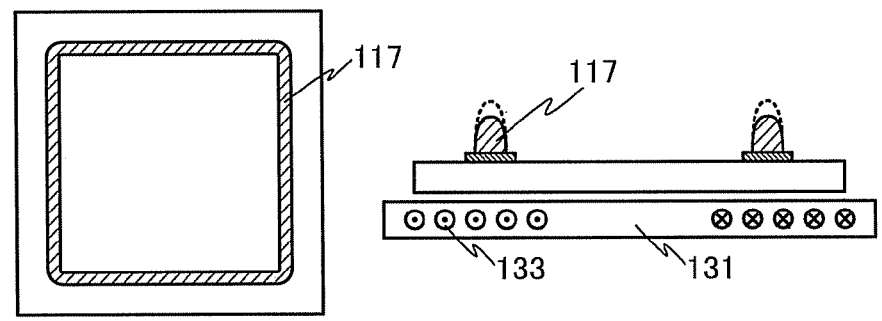
Figure 1D:
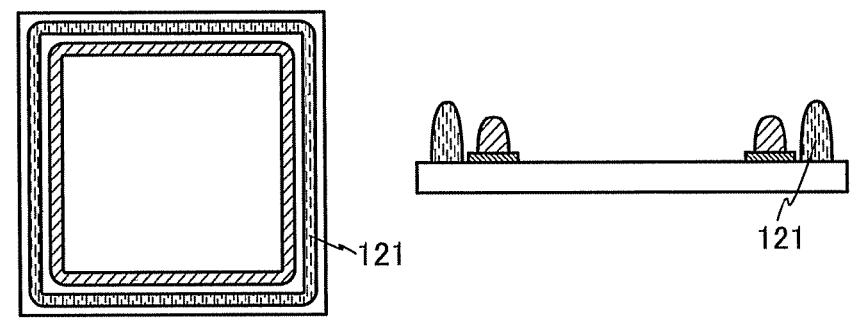

Next, the heat generation layer 113 is made to generate heat by induction heating using an induction heating apparatus 131; thus, the frit paste 115 over the heat generation layer 113 is baked (see FIG. 1C).

The induction heating apparatus 131 includes a coil 133 and an alternating-current power supply is connected to the coil 133. An output control circuit (not illustrated) is provided for the induction heating apparatus 131. The output control circuit controls alternating-current flowing through the coil 133 to control the frequency and the intensity of a magnetic field created by the coil 133 in the induction heating apparatus 131. The coil 133 is arranged in accordance with a position of the heat generation layer 113 so that the heat generation layer 113 which is an object to be heated uniformly generates heat.

Eddy current is generated in the heat generation layer 113 within the magnetic field created by the coil 133 in the induction heating apparatus 131, and the heat generation layer 113 generates heat using Joule heat of the eddy current. Thus, the frit paste 115 formed over the heat generation layer 113 can be heated by the heat generated by the heat generation layer 113.

The binder in the frit paste 115 is removed by this heating. Further, in this heating, the powder glass included in the frit material in the frit paste 115 is melted, fused, and then solidified; thus, glass fit 117 is formed.

It is known that in an induction heating method, a portion closer to a surface of a conductor generates a large amount of heat and heat generation decreases exponentially as the distance from the surface increases. As the lower frequency is used, a portion deeper inside the conductor can be heated. In this structure example, only the frit paste over the heat generation layer 113 needs to be heated; therefore, frequency is selected in accordance with the material and the thickness of the heat generation layer 113 so that at least a surface of the heat generation layer 113 sufficiently generates heat. Further, higher frequency is preferable because heating time can be shortened. The frequency in the range of higher than or equal to 1 Hz and lower than or equal to 10 MHz, preferably higher than or equal to 1 kHz and lower than or equal to 5 MHz is used.

Thus, by an induction heating method, it is possible to heat the heat generation layer 113 quickly, so that the frit paste 115 can be baked in an extremely short time, resulting in an increase in productivity.

Next, a sealant 121 formed. The sealant 121 is provided for temporarily bonding the first substrate to the second substrate. The first substrate and the second substrate are temporarily bonded to each other by the sealant 121, whereby a position of the first substrate relative to the second substrate is not changed. Note that in the case where the first substrate and the second substrate are not necessarily strictly aligned, the sealant 121 is not necessarily formed.

The sealant 121 is preferably positioned outside the glass frit 117. Although the sealant 121 may be formed inside the glass frit 117 having a shape of a closed curve, when the sealant 121 is formed outside the glass frit 117, an impurity such as an organic solvent included in the sealant 121 can be prevented from remaining in a sealed region in attachment of the substrates. This is preferable because the sealed region can be made clean. Further, the sealant 121 is preferably fanned to have a shape of a closed curve similar to the glass frit 117. The sealant 121 is formed to have a shape of a closed curve so as to surround the glass frit 117, whereby a laser irradiation step performed later can be performed in the air. Accordingly, an apparatus used in the laser irradiation step can have a simple structure.

The sealant 121 can be formed by a printing method such as a screen printing method, or a dispensing method, for example. The sealant 121 is fowled thicker than at least a stack of the glass frit 117 and the heat generation layer 113. A photocurable resin, preferably an ultraviolet curable region can be used for the sealant 121.

Figure 2A:
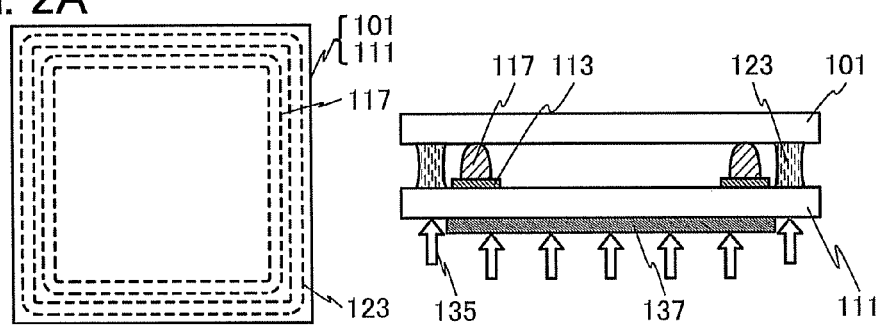
FIGS. 2A and 2B illustrate a method for manufacturing a sealed body, according to an embodiment of the present invention.

Then, the second substrate 101 and the first substrate 111 over which the glass frit 117 and the sealant 121 are formed are bonded to each other (see FIG. 2A).

The first substrate 111 and the second substrate 101 are bonded to each other so that the sealant 121 is closely attached to the second substrate 101. After that, the sealant 121 is irradiated with ultraviolet light 135 to be cured, so that the first substrate 111 and the second substrate 101 are temporality bonded to each other. The sealant 121 is cured and becomes a sealant 123 when irradiated with the ultraviolet light 135.

The bonding step is preferably performed in an atmosphere which does not include water, oxygen, or the like, for example, in an atmosphere of an inert gas such as a rare gas or nitrogen, or in a reduced-pressure atmosphere. When the bonding step is performed in such an atmosphere; the sealed region can be filled with a clean atmosphere.

Irradiation of the ultraviolet light 135 is performed in such a manner that, for example, as illustrated in FIG. 2A, a shielding plate 137 which does not transmit ultraviolet light is attached to a side which is irradiated with the ultraviolet light 135 and irradiation of an ultraviolet ray is performed using an ultraviolet lamp or the like. At this time, it is preferable that the sealed region be shielded from the ultraviolet light 135 by the shielding plate 137 and that pressure be applied from the outside. With the application of the pressure from the outside, the glass frit 117 is bonded to the second substrate 101 and thus temporary bonding can be performed. Note that the method of irradiation of the ultraviolet light 135 is not limited thereto. Irradiation of the ultraviolet light 135 may be performed along the sealant 121 with the use of a linear light source, or irradiation of the ultraviolet light 135 may be performed while the first substrate 111 is relatively scanned with a light source. By any of the irradiation methods, the shielding plate 137 is preferably provided for preventing diffusion of ultraviolet light inside the sealed region.

In this manufacturing method example, the irradiation of the ultraviolet light 135 is performed from the first substrate 111 side; however, the irradiation of the ultraviolet light 135 may be performed from the second substrate 101 side in a similar manner.

Figure 2B:
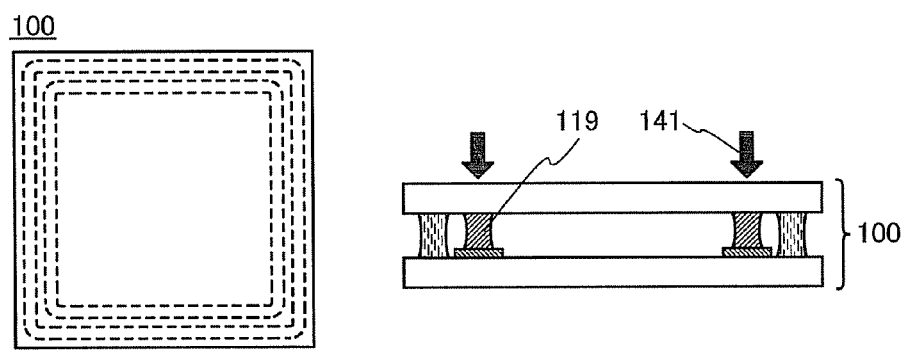

Next, the glass frit 117 is irradiated with laser light 141, so that the first substrate 111 and the second substrate 101 are bonded to each other (see FIG. 2B).

Irradiation of the laser light 141 is performed while a region where the glass frit 117 is formed is scanned with the laser light 141. The step of irradiation of the laser light 141 is preferably performed while the pressure is applied from the outside to the first substrate 111 and the second substrate 101. The glass frit 117 is melted by the laser light 141 to be bonded to the second substrate 101 in their contact portion. After that, the glass frit 117 is solidified, so that glass frit 119 which bonds the heat generation layer 113 to the second substrate 101 is formed. Since the glass frit 119 has an extremely high gas barrier property, a closed area (also referred to as a sealed region) which is surrounded by the first substrate 111, the second substrate 101, and the glass frit 119 is completely shielded from the external air.

The irradiation of the laser light 141 can be performed from a light-transmitting substrate side. The irradiation of the laser light 141 may be performed from either the first substrate 111 side, which is provided with the heat generation layer 113, or the second substrate 101 side. In the case where the heat generation layer 113 has a light absorption property with respect to the laser light 141 having a predetermined wavelength, the heat generation layer 113 is heated and the glass frit 117 can be indirectly heated; thus, the glass frit 117 can be heated more efficiently.

As the laser light 141, laser light having a wavelength which allows the laser light to transmit a substrate on the side irradiated with the laser light and energy which is large enough to heat one of or both the glass frit 117 and the heat generation layer 113 is used. As the laser light 141, an Nd:YAG laser, a semiconductor layer, or the like is preferably used, for example. Note that an absorber which absorbs light having the wavelength of the laser light 141 may be added to the glass frit 117.

In the case where the sealant 123 is formed outside the glass frit 117 to have a shape of a closed curve, the step of the irradiation of the laser light 141 can be performed in the air. In other words, since the sealed region is shielded from the external air by the sealant 123, an impurity such as water or oxygen included in the air can be prevented from entering the sealed region even when the step of the irradiation of the laser light 141 is performed in the air. Accordingly, an apparatus used for the irradiation of the laser light 141 can have a simple structure. In the case where the sealant 123 is not provided or the sealant 123 has an island shape, the step of the irradiation of the laser light 141 is preferably performed in a reduced-pressure atmosphere or an inert atmosphere.

In the case where the first substrate 111 and the second substrate 101 are bonded to each other and the sealant 121 is irradiated with the ultraviolet light 135 in a reduced-pressure atmosphere, the pressure in the sealed region is kept reduced. Therefore, since atmospheric pressure is kept being applied to the first substrate 111 and the second substrate 101 under the atmospheric pressure, the step of the irradiation of the laser light 141 can be performed without providing a pressure application unit.

Through the above steps, a highly airtight sealed body 100 can be manufactured.

A sealed body sealed by two substrates and glass frit is manufactured in the above-described manner, so that the sealed body can have extremely high airtightness. Further, when a frit paste is baked by induction heating, the frit paste can be locally baked without directly heating a substrate provided with the frit paste. Therefore, this method can also be used for a substrate provided with a material having low heat resistance. Furthermore, by an induction heating method, baking can be performed in an extremely short time and a structure of an apparatus used for the baking can be simpler than that of an oven or a furnace. Accordingly, manufacturing cost and initial investment are suppressed and a highly productive method for manufacturing a sealed body can be provided.

MANUFACTURING METHOD EXAMPLE 2

When a conductive material is included in a frit paste, the frit paste itself can be baked by an induction heating method without the heat generation layer 113. A method for manufacturing a sealed body with the use of a frit paste including a conductive material will be described below with reference to FIGS. 3A to 3E. Note that description of the portions described in Manufacturing Method Example 1 is omitted or is simply given.

FIGS. 3A to 3E illustrate a method for manufacturing a sealed body described in this manufacturing method example. Note that each of FIGS. 3A to 3E illustrates a schematic cross-sectional view of a step.

Figure 3A:
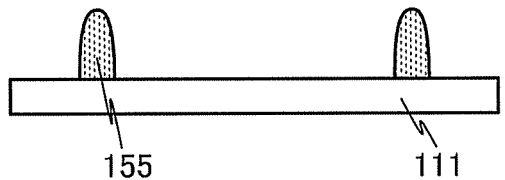
FIGS. 3A to 3E illustrate a method for manufacturing a sealed body, according to an embodiment of the present invention.

First, a frit paste 155 is formed over the first substrate 111 (see FIG. 3A).

The frit paste 115 to which a conductive material is added is used as the frit paste 155. Any of the materials which can be used for the heat generation layer 113 can be used as the conductive material. The conductive material is preferably a powder material and is mixed in the binder together with the frit material. The diameter of the powder material is larger than or equal to 1 nm and smaller than or equal to 100 preferably larger than or equal to 1 nm and smaller than or equal to 10 μm.

The frit paste 155 can be formed over the first substrate 111 in a manner similar to that described in Manufacturing Method Example 1.

Figure 3B:
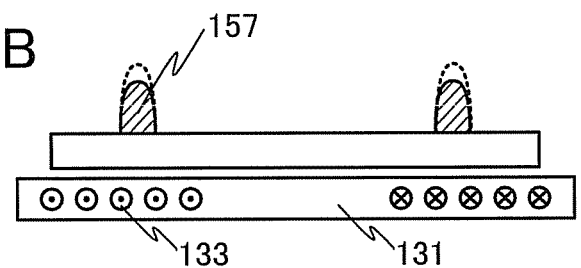

Then, the frit paste 155 is heated using the induction heating apparatus 131 (see FIG. 3B).

The conductive material in the frit paste 155 generates heat due to a magnetic field created by the coil 133 in the induction heating apparatus 131, whereby the binder in the frit paste 155 is removed by the generated heat and the powder glass in the frit material is melted. Thus, glass frit 157 is formed.

Figure 3C:
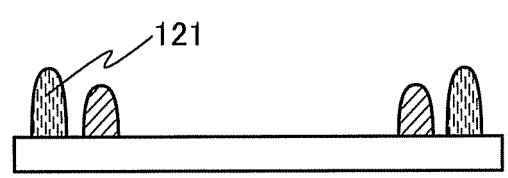
Figure 3D:
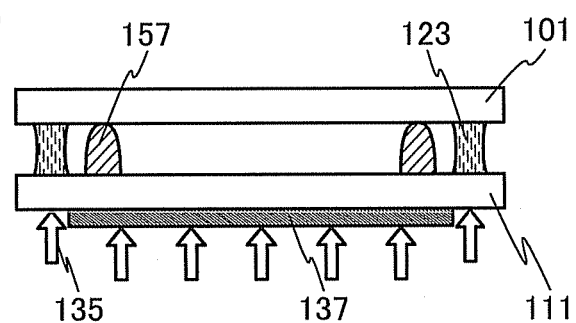
Figure 3E:
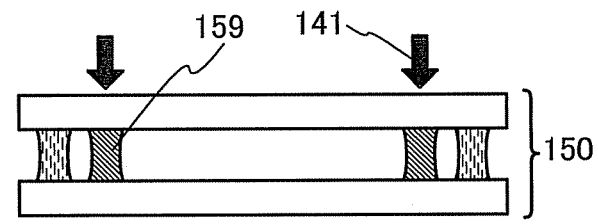

Next, in a manner similar to that described in Manufacturing Method Example 1, the sealant 121 is formed (see FIG. 3C). Further, the first substrate 111 over which the glass frit 157 is formed and the second substrate 101 are attached to each other and irradiation of the ultraviolet light 135 is performed; thus, the first substrate 111 and the second substrate 101 are temporarily bonded to each other (see FIG. 3D).

After that, a region where the glass frit 157 is formed is selectively irradiated with the laser light 141. The glass frit 157 is melted by the irradiation of the laser light 141 and then solidified, so that glass frit 159 which bonds the first substrate 111 to the second substrate 101 is formed. It is preferable that the conductive material included in the glass frit 157 have an absorption property with respect to the laser light 141 because the glass frit 157 can be heated more efficiently. Note that an absorber which absorbs light having the wavelength of the laser light 141 may be added to the glass frit 157.

Through the above steps, a highly airtight sealed body 150 can be manufactured.

Note that the glass frit 159 which has been subjected to the irradiation of the laser light 141 includes the conductive material. Particles of the powder conductive material are dispersed in the glass frit 159. Note that the particles of the conductive material may partly gather in some cases.

With such a method, the step of forming the heat generation layer 113 can be omitted, and a more highly productive method for manufacturing a sealed body 150 can be provided. Further, the heat generation layer 113 is not provided between the glass fit 159 and the first substrate 111, so that adhesion between the glass frit 159 and the first substrate 111 is increased in some cases. For example, particularly in the case where a glass substrate is used as the first substrate 111, adhesion between the first substrate 111 and the glass frit 159 can be increased.

This embodiment can be combined with any of the other embodiments disclosed in this specification as appropriate.
(Embodiment 2)

In this embodiment, the method for manufacturing a sealed body according to an embodiment of the present invention, which is described in Embodiment 1 as an example, is used for a light-emitting device. In this embodiment, a method for manufacturing a light-emitting device including a material having low heat resistance, particularly a light-emitting device including a color filter, will be described with reference to FIGS. 4A to 4D.

Note that in this embodiment, description of the portions described in Embodiment 1 is omitted or is simply given.

MANUFACTURING METHOD EXAMPLE

FIGS. 4A to 4D illustrate a method for manufacturing a light-emitting device described in this manufacturing method example. In each of FIGS. 4A to 4D, a schematic top view and a corresponding schematic cross-sectional view are illustrated.

First, the heat generation layer 113 is formed over the first substrate 111. The heat generation layer 113 can be formed using the material and the method which are described in Embodiment 1.

Then, a color filter 181 is formed over the first substrate 111. The color filter 181 is provided for adjusting a color of light emitted from a light-emitting unit 183 described later. In the case of a full-color light-emitting device (an image display device or a lighting device capable of adjusting a color), color filters having different colors are provided. In that case, three colors, red (R), green (G), and blue (B), may be used, or four colors, red (R), green (G), blue (B), and yellow (Y), may be used. Further, a black matrix (BM) may be provided between the color filters. In the case of a lighting device capable of adjusting a color, a color filter of one color may be provided, or a plurality of color filters of two or more colors may be alternately provided in stripes or in a tiled pattern. Further, a BM may be provided between the color filters. The color filter is provided to overlap with a pixel or a unit region of light emission in the light-emitting unit.

The color filter 181 can be formed in a desired position by a printing method, an inkjet method, a photolithography method, or the like. In particular, in a high-definition image display device, the color filter 181 is preferably formed by a photolithography method.

An organic resin including a pigment can be used for the color filter 181. Further, it is preferable that a light-transmitting chromatic resin be used. A photosensitive or non-photosensitive organic resin can be used as such an organic resin. In the case where the color filter 181 is formed by a photolithography method, a photosensitive organic resin is preferably used because a process can be simplified.

An overcoat layer covering the color filter 181 may be provided. With the overcoat layer, deterioration of the color filter 181 or leakage of the pigment from the color filter 181 can be suppressed; thus, a highly reliable light-emitting device can be manufactured. The overcoat layer can be formed using a light-transmitting layer including an organic material, a light-transmitting layer including an inorganic material, or a stack thereof.

Next, the frit paste 115 is formed over the heat generation layer 113. The frit paste 115 can be formed using the method described in Embodiment 1.

Figure 4A:
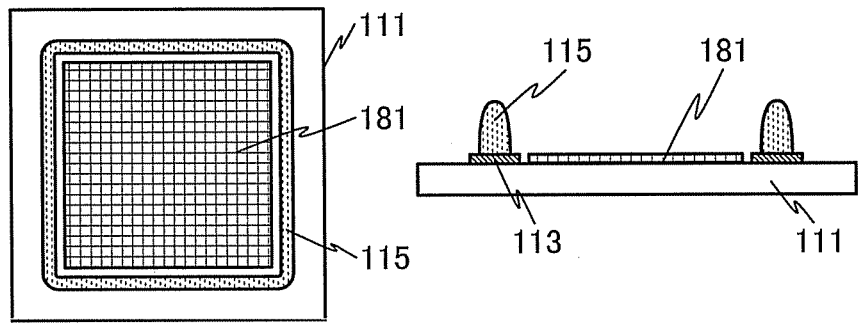
FIGS. 4A to 4D illustrate a method for manufacturing a light-emitting device, according to an embodiment of the present invention.

FIG. 4A illustrates a schematic top view and a schematic cross-sectional view at this stage.

Figure 4B:
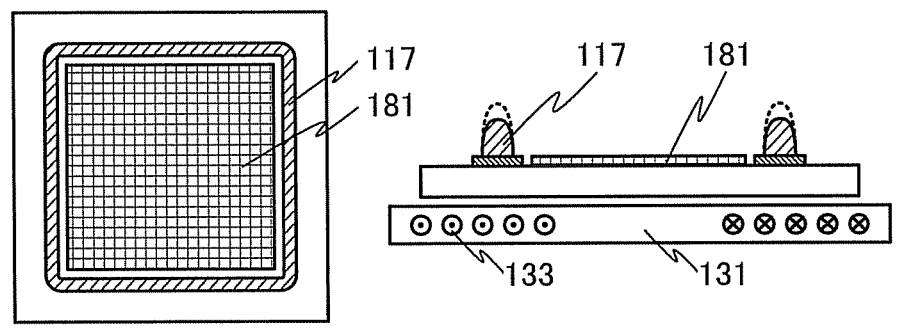

Next, the heat generation layer 113 is heated by an induction heating method with the use of the induction heating apparatus 131, so that the frit paste 115 is indirectly baked (see FIG. 4B). The frit paste 115 is baked, whereby the binder in the frit paste 115 is removed and the frit material is melted, fused, and then solidified; thus, the glass frit 117 is formed.

When an induction heating method is used in baking of the frit paste 115, the heat generation layer 113 can be heated locally and the color filter 181 formed over the same substrate as the heat generation layer 113 is hardly heated. Accordingly, the frit paste 115 can be baked without a thermal effect on the color filter 181.

Further, by the induction heating method, it is possible to heat the heat generation layer 113 quickly, so that the frit paste 115 can be baked in an extremely short time, resulting in an increase in productivity. Moreover, even in the case where heat generated by the heat generation layer 113 is transmitted to the color filter 181 via the substrate, the adverse effect can be minimized because heating time is extremely short.

Next, the sealant 121 is formed over the first substrate 111. The sealant 121 can be formed using the method described in Embodiment 1.

Figure 4C:
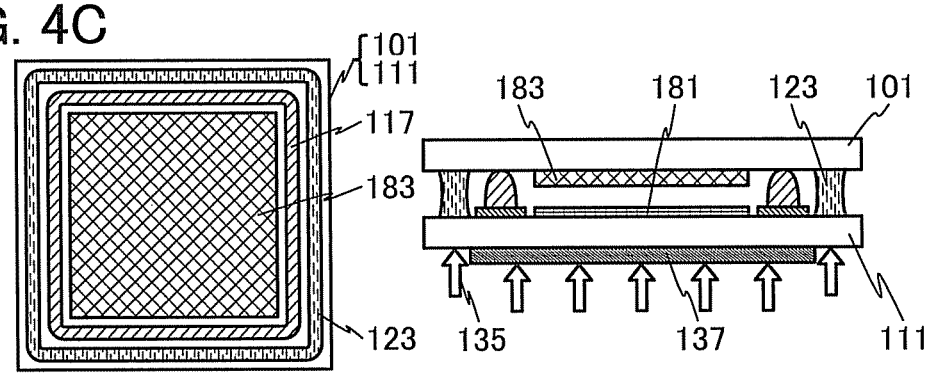

Then, the first substrate 111 and the second substrate 101 which is provided with the light-emitting unit 183 are attached to each other, and then the sealant 121 is irradiated with the ultraviolet light 135 to be cured; thus, the second substrate 101 and the first substrate 111 are temporarily bonded to each other (see FIG. 4C). By the irradiation of the ultraviolet light 135, the sealant 121 is cured and becomes the sealant 123 which bonds the first substrate 111 to the second substrate 101.

The first substrate 111 and the second substrate 101 are attached to each other so that a position of the light-emitting unit 183 relative to the color filter 181 is not changed. Note that an alignment marker for alignment may be provided for the first substrate 111 and the second substrate 101 in advance. In the case where the alignment marker is provided for the first substrate 111, the alignment marker is preferably formed at the same time as the heat generation layer 113 or the color filter 181 because the process can be simplified.

A light-emitting unit including an organic EL element can be used as the light-emitting unit 183 provided for the second substrate 101. For example, a light-emitting unit having a large light-emitting portion, which is intended to be used as a lighting device, a passive matrix image display device, an active matrix image display device in which a thin film transistor and an organic EL element are combined, or the like can be used. An example of a structure which can be used for the light-emitting unit 183 will be described in detail in Embodiment 3.

It is preferable that the organic EL element in the light-emitting unit 183 provided for the second substrate 101 not be in contact with an impurity such as water or oxygen from the step of formation of the light-emitting unit 183 to the end of the step of temporary bonding. A series of steps is preferably performed in an inert atmosphere or a reduced-pressure atmosphere. In the case where the sealant 121 is formed to have a shape of a closed curve along the outer periphery of the first substrate 111, a step after temporary bonding can be conducted in the air.

Figure 4D:
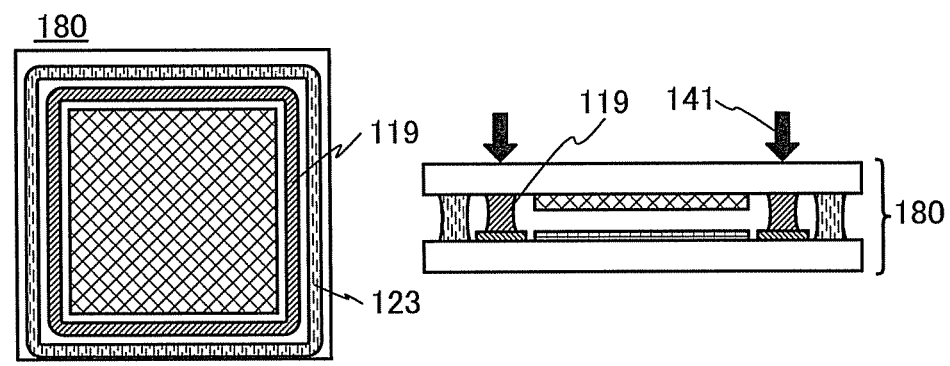

The glass frit 117 is irradiated with the laser light 141 to be melted and then solidified; thus, the glass frit 119 which bonds the first substrate 111 to the second substrate 101 is formed (see FIG. 4D). The irradiation of the laser light 141 can be performed in a manner similar to the manner described in Embodiment 1.

Through the above steps, a light-emitting device 180 sealed with the glass frit 119 can be manufactured.

When the light-emitting device 180 is manufactured in such a manner, the light-emitting device 180 can have high airtightness owing to the glass frit 119; thus, a highly reliable light-emitting device in which deterioration of the enclosed light-emitting unit 183 due to an impurity such as water or oxygen is suppressed can be manufactured.

Sealing with glass frit can be used for a substrate provided with a color filter having low heat resistance because a frit paste is baked by an induction heating method. Further, when the frit paste is baked by an induction heating method, baking of the frit paste can be performed in an extremely short time and a structure of an apparatus used for the baking can be simpler than that of an oven or a furnace. Accordingly, manufacturing cost and initial investment are suppressed and a highly productive method for manufacturing a sealed body can be provided.

This embodiment can be combined with any of the other embodiments disclosed in this specification as appropriate.

(Embodiment 3)

In this embodiment, an example of a structure of a light-emitting unit which can be used for the method for manufacturing a sealed body according to an embodiment of the present invention will be described with reference to FIGS. 5A and 5B and FIGS. 6A and 6B.

STRUCTURE EXAMPLE 1

Figure 5A:
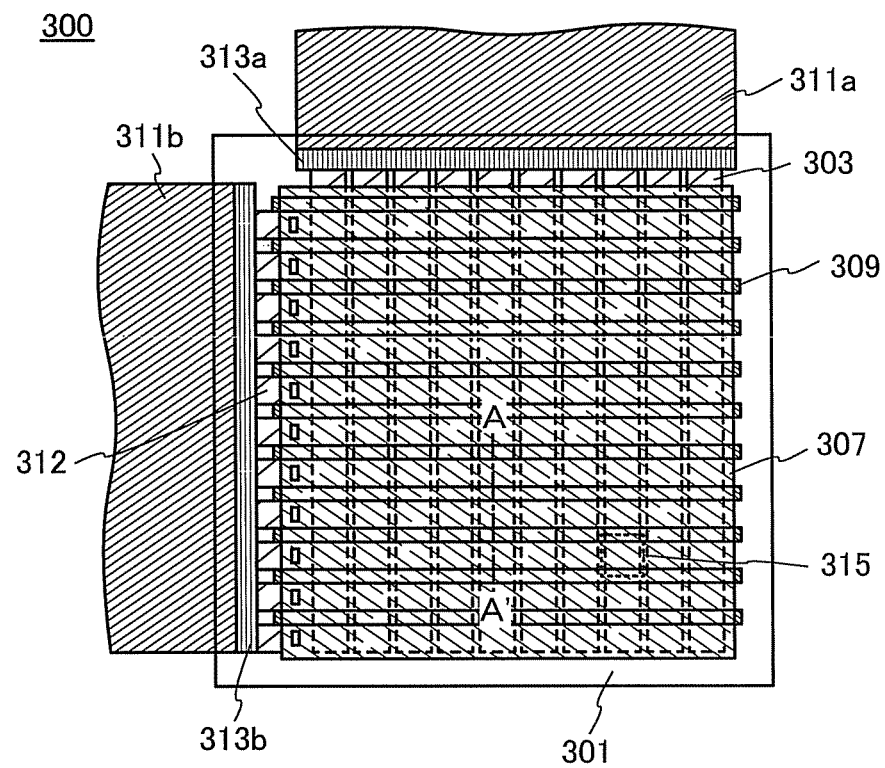
FIGS. 5A and 5B illustrate a light-emitting device according to an embodiment of the present invention.
Figure 5B:
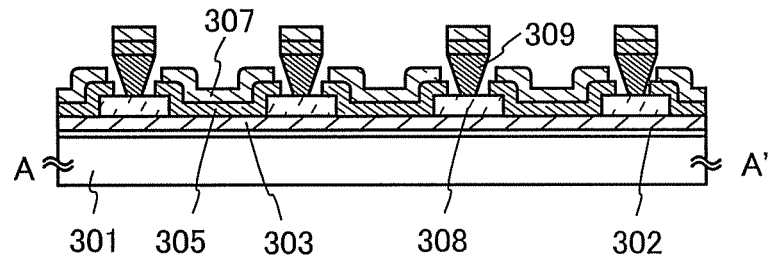

In this structure example, a passive matrix light-emitting unit is described as an example. FIG. 5A is a schematic top view of a passive matrix light-emitting unit 300 described in this structure example and FIG. 5B is a schematic cross-sectional view taken along line A-A' in FIG. 5A.

In a passive matrix (also called simple matrix) light-emitting unit, a plurality of anodes arranged in stripes (in stripe form) is provided to be perpendicular to a plurality of cathodes arranged in stripes, and a light-emitting layer is provided therebetween at each intersection. Therefore, a pixel at an intersection of an anode selected (to which a voltage is applied) and a cathode selected emits light.

The light-emitting unit 300 in FIG. 5A is formed over a substrate 301 and includes EL layers 305 between scan lines 303 and data lines 307. Partitions 309 are each provided between adjacent data lines 307 to electrically isolate the adjacent data lines 307. A region (region 315) where one of the scan lines 303 intersects with one of the data lines 307 corresponds to one pixel.

The scan lines 303 are electrically connected to a flexible printed circuit (FPC) 311a through an input terminal 313a. The data lines 307 are electrically connected to an FPC 311b through a connection wiring 312 and an input terminal 313b. An input signal from the outside is input to each of the FPC 311a and the FPC 311b.

A base layer 302 is formed over the substrate 301. The base layer 302 is provided for preventing diffusion of an impurity from the substrate 301 to the EL layers 305. The base layer 302 is not necessarily formed.

Over the base layer 302, the plurality of scan lines 303 is arranged in stripes at regular intervals. Each of the scan lines 303 serves as a lower electrode of an EL element. The connection wiring 312 may be formed using the same film as the scan lines 303.

An insulating layer 308 having opening portions corresponding to respective pixels is formed over the scan lines 303. The insulating layer 308 has an insulating property, and can be formed using a photosensitive or non-photosensitive organic material such as polyimide, polyamide, polyamide imide, or acrylic, or an SOG film formed using $SiO_x$ containing an alkyl group or the like. An end portion of the insulating layer 308 is preferably gently tapered. Note that each opening portion corresponding to a pixel is a light-emitting region.

The plurality of partitions 309 intersecting with the scan lines 303 is provided over the insulating layer 308. The partitions 309 are formed in parallel to each other, and are inversely tapered or T-shaped. Accordingly, the partitions 309 can physically isolate a film formed thereover.

The EL layers 305 and the data lines 307 are stacked in this order over the scan lines 303 and the partitions 309. Each of the data lines 307 serves as an upper electrode of the EL element. The EL layers 305 and the data lines 307 are each physically isolated by the partitions 309; thus, the EL layers 305 are electrically isolated from each other and the data lines 307 are electrically isolated from each other. Therefore, light-emitting regions corresponding to respective pixels are electrically isolated from each other and can independently emit light.

The data lines 307 electrically isolated by the partitions 309 are wirings extending in the direction intersecting with the scan lines 303 and arranged in stripes. Although films of the EL layers 305 and the data lines 307 are formed over the partitions 309, they are physically and electrically isolated from the EL layers 305 and the data lines 307.

The method for manufacturing a sealed body, which is described in the above embodiments, can be used for the light-emitting unit 300. The light-emitting unit 300 is placed in a highly airtight sealed region having high airtightness, which is sealed with glass frit, whereby deterioration of the EL element can be greatly suppressed. Thus, a highly reliable light-emitting device can be provided.

Note that although FIGS. 5A and 5B illustrate an example in which a driver circuit is not provided over the substrate, an IC chip including a driver circuit may be mounted on the substrate.

When the IC chip is mounted, a data line side IC and a scanning line side IC, in each of which the driver circuit for transmitting a signal to a pixel portion is formed, are mounted on the periphery of (outside) the pixel portion. As a method for mounting an IC chip, a COG method, TCP, a wire bonding method, or the like can be used. The TCP is a TAB tape mounted with the IC, and the TAB tape is connected to a wiring over an element formation substrate to mount the IC. The data line side IC and the scanning line side IC may be formed using a silicon substrate, a silicon on insulator (SOI) substrate, a glass substrate, a quartz substrate, or a plastic substrate.

STRUCTURE EXAMPLE 2

Figure 6A:
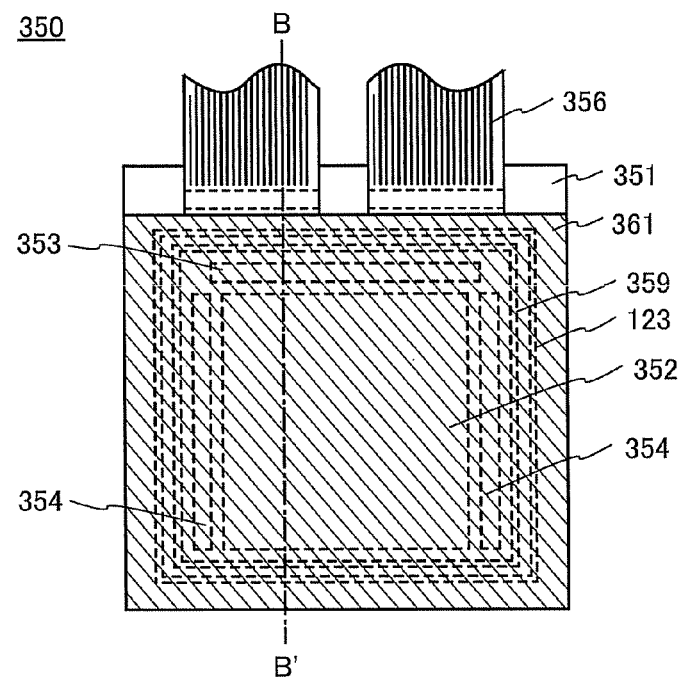
FIGS. 6A and 6B illustrate a light-emitting device according to an embodiment of the present invention.
Figure 6B:
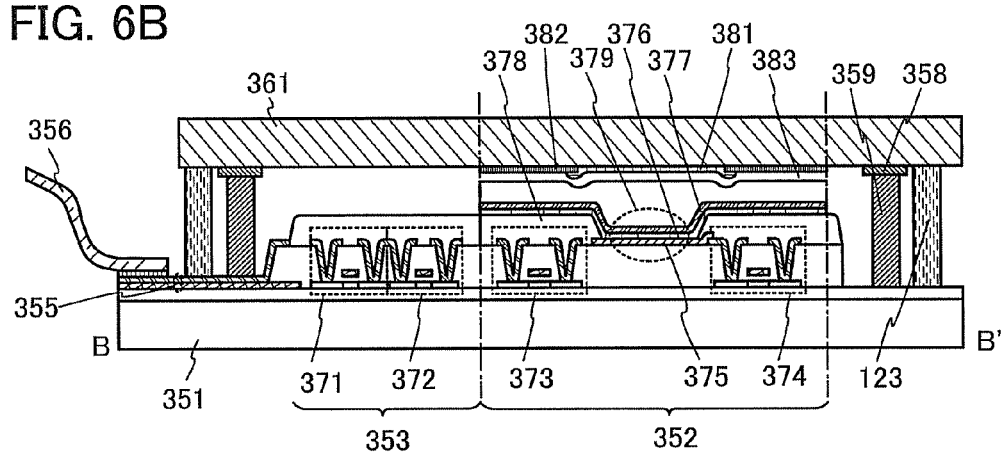

In this structure example, an example of a structure in which the sealing method with glass frit according to an embodiment of the present invention is used for an active matrix light-emitting unit will be described. FIG. 6A is a schematic top view of a light-emitting device 350 in which an active matrix light-emitting unit of this example is included, and FIG. 6B is a schematic cross-sectional view taken along line B-B' in FIG. 6A.

The active matrix light-emitting device 350 of this embodiment includes a pixel portion 352 provided over a second substrate 351, a driver circuit portion (source driver circuit) 353, and a driver circuit portion (gate driver circuit) 354. The pixel portion 352, the driver circuit portion 353, and the driver circuit portion 354 are sealed in a glass sealed body which is surrounded by glass fit 359, the second substrate 351, and a first substrate 361.

A lead wiring 355 for connecting an external input terminal which transmits a signal (e.g., a video signal, a clock signal, a start signal, or a reset signal) or potential from the outside to the driver circuit portion 353 and the driver circuit portion 354 is provided over the second substrate 351. Here, an example is described in which an FPC 356 is provided as the external input terminal. Note that although only an FPC is illustrated here, a printed wiring board (PWB) may be attached to the FPC. In this specification, the light-emitting device includes in its category the light-emitting device itself and a light-emitting device on which an FPC or a PWB is mounted.

Next, a cross-sectional structure of the light-emitting device 350 including the active matrix light-emitting unit is described with reference to FIG. 6B. Although the driver circuit portion 353, the driver circuit portion 354, and the pixel portion 352 are formed over the second substrate 351, the pixel portion 352 and the driver circuit portion 353 which is the source driver circuit are illustrated in FIG. 6B.

In the driver circuit portion 353, an example including a CMOS circuit which is a combination of an n-channel TFT 371 and a p-channel TFT 372 is illustrated. Note that a circuit included in the driver circuit portion can be formed using various types of circuits such as a CMOS circuit, a PMOS circuit, or an NMOS circuit. In this embodiment, a driver-integrated type in which a driver circuit and the pixel portion are formed over the same substrate is described; however, the present invention is not limited to this structure, and a driver circuit can be formed over a substrate that is different from the substrate over which a pixel portion is formed.

The pixel portion 352 has a plurality of pixels each of which includes a switching TFT 373, a current control TFT 374, and a lower electrode 375 electrically connected to a wiring (a source electrode or a drain electrode) of the current control TFT 374. An insulating layer 378 is formed so as to cover an end portion of the lower electrode 375. In this embodiment, the insulating layer 378 is formed using a positive photosensitive acrylic resin. Note that there is no particular limitation on structures of the TFTs such as the switching TFT 373 and the current control TFT 374. For example, a staggered TFT or an inverted staggered TFT may be used. A top-gate TFT or a bottom-gate TFT may also be used. There is no particular limitation also on materials of a semiconductor used for the TFTs, and silicon or an oxide semiconductor such as an oxide including at least one of indium, gallium, and zinc may be used. In addition, crystallinity of a semiconductor used for the TFTs is not particularly limited either; an amorphous semiconductor or a crystalline semiconductor may be used.

A light-emitting element 379 includes the lower electrode 375, an EL layer 376, and an upper electrode 377. A structure, materials, and the like of the light-emitting element will be described in detail in Embodiment 4. Although not illustrated, the upper electrode 377 is electrically connected to the FPC 356 which is an external input terminal.

The insulating layer 378 is formed so as to cover an end portion of the lower electrode 375. In addition, in order that the upper electrode 377 that is formed over the insulating layer 378 at least favorably covers the insulating layer 378, the insulating layer 378 is preferably formed so as to have a curved surface with curvature at an upper end portion or a lower end portion. For example, it is preferable that the upper end portion or the lower end portion of the insulating layer 378 have a curved surface with a radius of curvature (0.2 μm to 3 μm). The insulating layer 378 can be formed using an organic compound such as a negative photosensitive resin which becomes insoluble in an etchant by light or a positive photosensitive resin which becomes soluble in an etchant by light, or an inorganic compound such as silicon oxide or silicon oxynitride.

A color filter 381 is provided for the first substrate 361 in a position overlapping with the light-emitting element 379. Any of the materials and structures described in the above embodiments can be applied to the color filter 381. A black matrix 382 is provided in a region which does not overlap with the light-emitting element 379. When an end portion of the color filter 381 overlaps with the black matrix 382, light leakage can be suppressed. A material which does not transmit light emitted from the light-emitting element 379 can be used for the black matrix 382, and a material such as metal or an organic resin can be used. Alternatively, the black matrix 382 may be formed using the same layer as a heat generation layer 358.

An overcoat 383 covering the color filter 381 and the black matrix 382 is formed. The overcoat 383 is formed using a material which transmits light emitted from the light-emitting element 379, and an insulating film including silicon or an organic insulating film can be used, for example. Note that the overcoat 383 is not necessarily formed.

Although only one light-emitting element 379 is illustrated in the cross-sectional view of FIG. 6B, a plurality of light-emitting elements is arranged in matrix in the pixel portion 352. For example, light-emitting elements that emit light of three kinds of colors (R, G, and B) are selectively formed in the pixel portion 352, so that a light-emitting device capable of full color display can be obtained. Moreover, a light-emitting device capable of full color display can be obtained by a combination of a color filter and a light-emitting element including an EL layer emitting white light to be described in a later embodiment. The light-emitting element can have either a top emission structure or a dual emission structure.

The light-emitting element 379 is provided in a sealed region surrounded by the first substrate 361, the second substrate 351, and the glass frit 359. The sealed region may be filled with a rare gas, a nitrogen gas, or a solid, or may be a reduced-pressure atmosphere.

For the first substrate 361, the heat generation layer 358 is provided in a region. overlapping with the glass fit 359. In the case where the glass fit 359 includes a conductive material, the heat generation layer 358 is not necessarily provided. In the case where the glass fit 359 includes a conductive material, an insulating layer is provided over the lead wiring 355 for the prevention of short circuit between the lead wiring 355 and the glass frit 359. A film which has favorable adhesion to the glass frit 359 and can withstand temperature at which the glass frit 359 is melted is used as the insulating layer. For example, an oxide film or a nitride film such as a silicon oxide film, a silicon nitride film, or an aluminum oxide film can be used.

As described above, a light-emitting device including an active matrix light-emitting unit formed using the method for manufacturing a sealed body according to an embodiment of the present invention can be obtained. The light-emitting device has a longer lifetime and is strong against external force such as impact, distortion, or the like.

(Embodiment 4)

In this embodiment, examples of EL layers that can be applied to an embodiment of the present invention will be described with reference to FIGS. 7A to 7C.

Figure 7A:
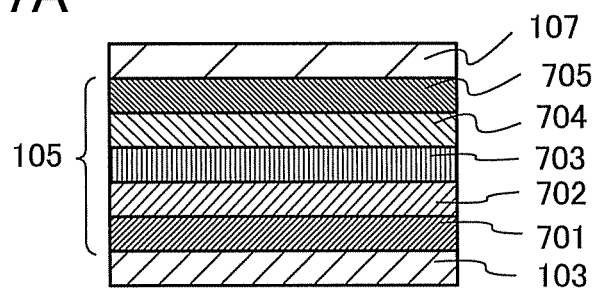
FIGS. 7A to 7C each illustrate an EL layer according to an embodiment of the present invention.

As illustrated in FIG. 7A, an EL layer 105 is provided between a first electrode 103 and a second electrode 107. The first electrode 103 and the second electrode 107 can have a structure similar to that of the lower electrode or the upper electrode, which are described in any of the above embodiments.

A light-emitting element including the EL layer 105 described as an example in this embodiment can be used in any of the light-emitting devices described as examples in the above embodiments.

The EL layer 105 includes at least a light-emitting layer containing a light-emitting organic compound. In addition, the EL layer 105 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. In this embodiment, in the EL layer 105, a hole-injection layer 701, a hole-transport layer 702, a layer 703 containing a light-emitting organic compound, an electron-transport layer 704, and an electron-injection layer 705 are stacked in this order from the first electrode 103 side. Note that the stacking order may be inversed.

A manufacturing method of the light-emitting element illustrated in FIG. 7A will be described.

The hole-injection layer 701 is a layer containing a substance having a high hole-injection property. As the substance having a high hole-injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: H$_2$Pc), or copper(II) phthalocyanine (abbreviation: CuPc) can also be used.

Alternatively, an aromatic amine compound, which is a low molecular organic compound or the like, can be used.

Any of high molecular compounds (e.g., oligomers, dendrimers, or polymers) can also be used. A high molecular compound to which acid is added can be used.

In particular, for the hole-injection layer 701, a composite material in which an acceptor substance is mixed with an organic compound having a high hole-transport property is preferably used. With the use of the composite material in which an acceptor substance is added to a substance having a high hole-transport property, excellent hole injection from the first electrode 103 can be obtained, which results in a reduction in the drive voltage of the light-emitting element. Such a composite material can be formed by co-evaporation of a substance having a high hole-transport property and an acceptor substance. When the hole-injection layer 701 is formed using the composite material, holes are easily injected from the first electrode 103 into the EL layer 105.

As the organic compound used for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole-transport property. Specifically, a substance having a hole mobility of $10^{-6}$ cm$^2$/Vs or higher is preferably used. Note that any other substances may also be used as long as the hole-transport property thereof is higher than the electron-transport property thereof.

As the organic compound which can be used for the composite material, an aromatic amine compound, a carbazole derivative, an aromatic hydrocarbon compound having a high hole mobility can be used.

Examples of the acceptor substance include organic compounds and transition metal oxides. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable because of their electron-accepting properties. Among these, molybdenum oxide is particularly preferable because it is stable in the air, has a low hygroscopic property, and is easily handled.

The composite material may be formed using the above electron acceptor and the above high molecular compound and used for the hole-injection layer 701.

The hole-transport layer 702 is a layer containing a substance having a high hole-transport property. As the substance having a high hole-transport property, for example, an aromatic amine compound can be used. The substance has a hole mobility of $10^{-6}$ cm$^2$/Vs or higher. Note that any other substances may also be used as long as the hole-transport property thereof is higher than the electron-transport property thereof. Note that the layer containing a substance having a high hole-transport property is not limited to a single layer and may be a stack of two or more layers containing any of the above substances.

In addition, a carbazole derivative, an anthracene derivative, or a high molecular compound having a high hole-transport property may also be used for the hole-transport layer 702.

For the layer 703 containing a light-emitting organic compound, a fluorescent compound which exhibits fluorescence or a phosphorescent compound which exhibits phosphorescence can be used.

Note that the layer 703 containing a light-emitting organic compound may have a structure in which a light-emitting organic compound (guest material) is dispersed in another substance (host material). As a host material, a variety of kinds of materials can be used, and it is preferable to use a substance which has a higher lowest unoccupied molecular orbital level (LUMO level) than the light-emitting material and has a lower highest occupied molecular orbital level (HOMO level) than the light-emitting material.

Alternatively, as the host material, plural kinds of materials can be used. For example, in order to suppress crystallization, a substance which suppresses crystallization may be further added. In addition, a different kind of substance may be further added in order to efficiently transfer energy to the guest material.

When a structure in which a guest material is dispersed in a host material is employed, crystallization of the layer 703 containing a light-emitting organic compound can be suppressed. Further, concentration quenching due to high concentration of the guest material can be suppressed.

A high molecular compound can also be used for the layer 703 containing a light-emitting organic compound.

Further, by providing a plurality of layers each containing a light-emitting organic compound and making the emission colors of the layers different, light emission having a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that "complementary colors" refer to colors that can produce an achromatic color when mixed. In other words, when lights obtained from substances which emit light of complementary colors are mixed, white emission can be obtained. This can be applied to a light-emitting element including three or more layers each containing a light-emitting organic compound.

The electron-transport layer 704 is a layer containing a substance having a high electron-transport property. Examples of the substance having a high electron-transport property are mainly ones that have an electron mobility of $10^{-6}$ cm$^2$/Vs or higher. The electron-transport layer is not limited to a single layer, and two or more layers made of the aforementioned substance may be stacked.

The electron-injection layer 705 is a layer containing a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. Any of the above substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (e.g., a vacuum evaporation method), an inkjet method, or a coating method.

Figure 7B:
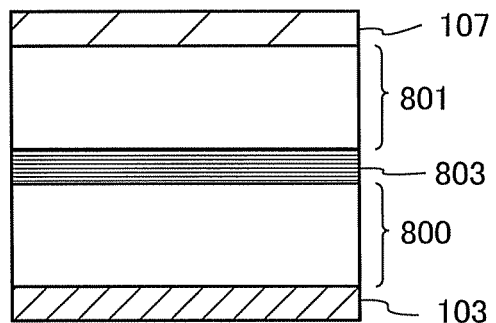

As illustrated in FIG. 7B, a plurality of EL layers may be stacked between the first electrode 103 and the second electrode 107. In that case, a charge generation layer 803 is preferably provided between a first EL layer 800 and a second EL layer 801 which are stacked. The charge generation layer 803 can be formed using the above composite material. Further, the charge generation layer 803 may have a stacked-layer structure including a layer containing the composite material and a layer containing another material. In that case, as the layer containing another material, a layer containing an electron-donating substance (donor substrate) and a substance having a high electron-transport property, a layer formed of a transparent conductive film, or the like can be used. As for a light-emitting element having such a structure, problems such as energy transfer and quenching hardly occur, and a light-emitting element which has both high emission efficiency and long lifetime can be easily obtained due to expansion in the choice of materials. Moreover, a light-emitting element which provides phosphorescence from one EL layer and fluorescence from another EL layer can be easily obtained. Note that this structure can be combined with any of the above structures of the EL layer.

Further, by forming EL layers to emit light of different colors from each other, a light-emitting element as a whole can provide light emission of a desired color. For example, in a light-emitting element having the two EL layers, the emission colors of the first and second EL layers are complementary, so that the light-emitting element can be made to emit white light as a whole. Note that "complementary colors" refer to colors that can produce an achromatic color when mixed. In other words, when lights obtained from substances which emit light of complementary colors are mixed, white emission can be obtained. This can be applied to a light-emitting element having three or more EL layers.

In order to obtain white light with favorable color rendering properties, light whose emission spectrum covers the whole visible light range is needed and thus a light-emitting element in which three or more EL layers are stacked is preferably used. For example, such a light-emitting element can be formed by stacking EL layers emitting light of the respective colors of red, blue, and green. In this manner, the color rendering properties of a light-emitting element can be improved by stacking EL layers of different three or more colors.

An optical adjustment layer may be formed between the first electrode 103 and the second electrode 107. The optical adjustment layer is a layer for adjusting the optical distance between a reflective electrode and a light-transmitting electrode. With the optical adjustment layer, light with a wavelength in a specific range can be enhanced and thus the color tone can be adjusted.

Figure 7C:
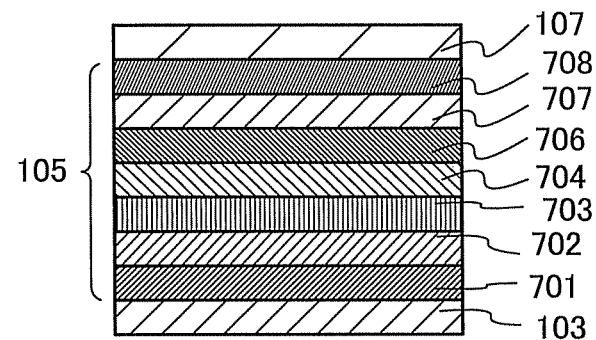

As illustrated in FIG. 7C, the EL layer 105 may include, between the first electrode 103 and the second electrode 107, the hole-injection layer 701, the hole-transport layer 702, the layer 703 containing a light-emitting organic compound, the electron-transport layer 704, an electron-injection buffer layer 706, an electron-relay layer 707, and a composite material layer 708 which is in contact with the second electrode 107.

The composite material layer 708 which is in contact with the second electrode 107 is preferably provided, in which case damage caused to the EL layer 105 particularly when the second electrode 107 is formed by a sputtering method can be reduced. The composite material layer 708 can be formed using the above composite material in which an acceptor substance is mixed with an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

A substance having a high electron-injection property can be used for the electron-injection buffer layer 706: for example, an alkali metal, an alkaline earth metal, a rare earth metal, a compound of the above metal (e.g., an alkali metal compound (including an oxide such as lithium oxide, a halide, or a carbonate such as lithium carbonate or cesium carbonate), an alkaline earth metal compound (including an oxide, a halide, or a carbonate), or a rare earth metal compound (including an oxide, a halide, or a carbonate)).

Further, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (including an oxide of lithium oxide or the like, a halide, and a carbonate such as lithium carbonate or cesium carbonate), an alkaline earth metal compound (including an oxide, a halide, and a carbonate), and a rare earth metal compound (including an oxide, a halide, and a carbonate)). Note that a material similar to the material for the electron transport layer 704 described above can be used as the substance having a high electron-injection property.

Furthermore, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other; thus, their functions hardly interfere with each other. Thus, an increase in the driving voltage can be prevented.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably greater than or equal to −5.0 eV, more preferably greater than or equal to −5.0 eV and less than or equal to −3.0 eV.

As the substance having a high electron-transport property contained in the electron-relay layer 707, a phthalocyanine-based material or a metal complex having a metal-oxygen bond and an aromatic ligand is preferably used.

As the metal complex having a metal-oxygen bond and an aromatic ligand, which is contained in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered stable. Thus, the use of the metal complex having a metal-oxygen double bond makes it possible to drive the light-emitting element at low voltage more stably.

As a metal complex having a metal-oxygen bond and an aromatic ligand, a phthalocyanine-based material is preferable. In particular, a substance in which a metal-oxygen double bond is more likely to act on another molecular in terms of a molecular structure and which has a high acceptor property is preferably used.

Note that a phthalocyanine-based material having a phenoxy group is preferable as the phthalocyanine-based material described above. Specifically, a phthalocyanine derivative having a phenoxy group, such as PhO-VOPc, is preferable. A phthalocyanine derivative having a phenoxy group is soluble in a solvent, and thus has an advantage of being easily handled during formation of a light-emitting element and an advantage of facilitating maintenance of an apparatus used for film formation.

The electron-relay layer 707 may further contain a donor substance. Examples of the donor substance include an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as lithium carbonate or cesium carbonate), alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance having a high electron-transport property, a substance having a LUMO level greater than the acceptor level of the acceptor substance contained in the composite material layer 708 can be used. As a specific energy level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron-relay layer 707 because of its stability.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the layer 703 containing a light-emitting organic compound, and the electron-transport layer 704 may each be faulted using any of the materials given above.

As described above, the EL layer 105 of this embodiment can be formed.

This embodiment can be combined with any of the other embodiments disclosed in this specification as appropriate.

(Embodiment 5)

In this embodiment, an example of an electronic device or a lighting device including a light-emitting device formed using the method for manufacturing a sealed body according to an embodiment of the present invention will be described with reference to FIGS. 8A to 8E.

Examples of the electronic devices to which the light-emitting device is applied are television devices (also referred to as TV or television receivers), monitors for computers and the like, cameras such as digital cameras and digital video cameras, digital photo frames, mobile phones (also referred to as cellular phones or cellular phone devices), portable game machines, portable information terminals, audio playback devices, large game machines such as pachinko machines, and the like. Specific examples of these electronic devices are illustrated in FIGS. 8A to 8E.

Figure 8A:
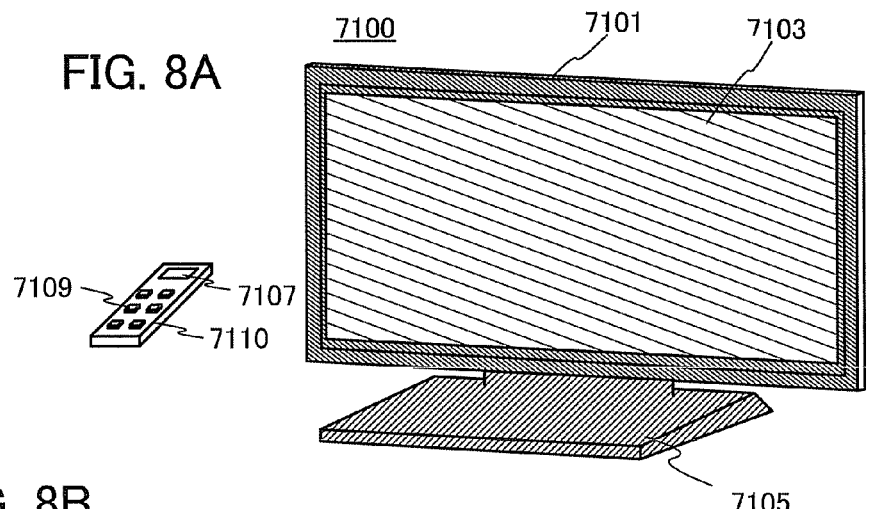
FIGS. 8A to 8E illustrate electronic devices according to embodiments of the present invention.

FIG. 8A illustrates an example of a television device. In the television device 7100, a display portion 7103 is incorporated in a housing 7101. The display portion 7103 is capable of displaying images, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 8B:
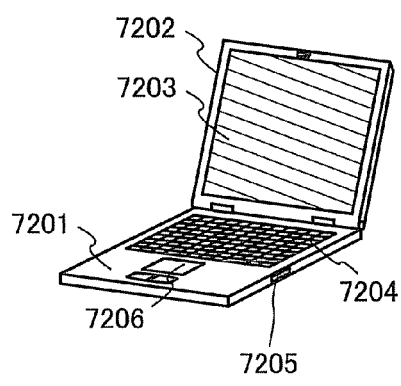

FIG. 8B illustrates a computer, which includes a main body 7201, a housing 7202, a display portion 7203, a keyboard 7204, an external connecting port 7205, a pointing device 7206, and the like. Note that this computer is manufactured using the light-emitting device for the display portion 7203.

Figure 8C:
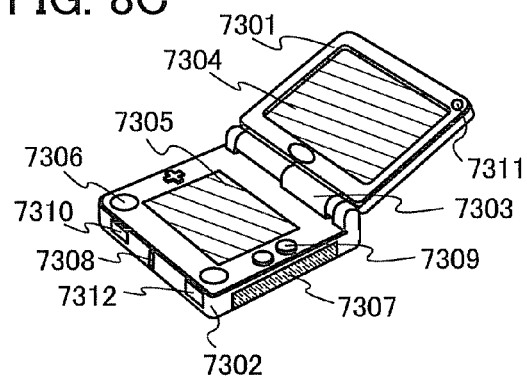

FIG. 8C illustrates a portable game machine, which includes two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 8C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as a light-emitting device can be used for at least either the display portion 7304 or the display portion 7305, or both, and may include other accessories as appropriate. The portable game machine illustrated in FIG. 8C has a function of reading out a program or data stored in a storage medium to display it on the display portion, and a function of sharing information with another portable game machine by wireless communication. The portable game machine in FIG. 8C can have a variety of functions without limitation to the above functions.

Figure 8D:
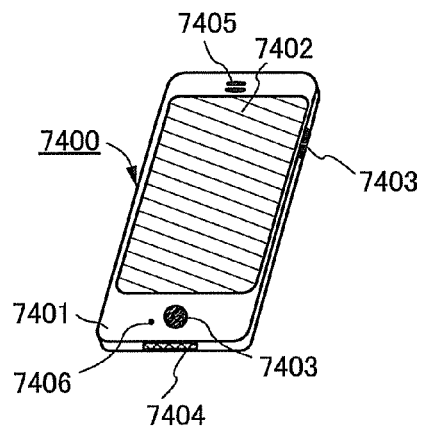

FIG. 8D illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using the light-emitting device for the display portion 7402.

When the display portion 7402 of the mobile phone 7400 illustrated in FIG. 8D is touched with a finger or the like, data can be input into the mobile phone 7400. Further, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. The screen modes can also be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 8E:
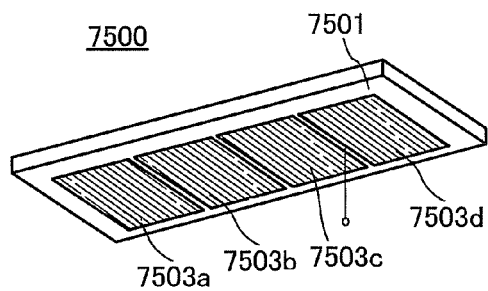

FIG. 8E illustrates an example of a lighting device. In a lighting device 7500, light-emitting devices 7503a to 7503d of an embodiment of the present invention are incorporated in a housing 7501 as light sources. The lighting device 7500 can be attached to a ceiling, a wall, or the like.

The light-emitting device according to an embodiment of the present invention includes a light-emitting panel which can be formed in a film form. Thus, when the light-emitting device is attached to a base with a curved surface, the light-emitting device with a curved surface can be obtained. In addition, when the light-emitting device is located in a housing with a curved surface, an electronic device or a lighting device with a curved surface can be obtained.

Further, the light-emitting device includes a light-emitting panel which emits light having high brightness and a pale color and causing less eyestrain even in the case of long-time use, light of a bright red color, and light of a bright color different from the other colors. By adjusting conditions under which the light-emitting element is driven for each emission color, a lighting device whose hue can be adjusted by a user can be achieved.

The method for manufacturing a sealed body with the use of glass frit according to an embodiment of the present invention is used for the light-emitting device used for the electronic device or the lighting device. Thus, a highly reliable electronic device or lighting device can be obtained because the light-emitting element can be enclosed in the sealed region having high airtightness.

This embodiment can be combined with any of the other embodiments disclosed in this specification as appropriate.

This application is based on Japanese Patent Application serial no. 2011-133957 filed with Japan Patent Office on Jun. 16, 2011, the entire contents of which are hereby incorporated by reference.

What is claimed is:

1. A method for manufacturing a sealed body, comprising the steps of:
   forming a heat generation layer over a first substrate;
   forming a frit paste comprising a frit material and a binder over the heat generation layer;
   heating the heat generation layer by induction heating to remove the binder and to fuse the frit material so that a glass frit is formed;
   arranging the first substrate and a second substrate to interpose the glass frit therebetween; and
   irradiating the glass frit with laser light to bond the glass frit to the second substrate.

2. The method for manufacturing a sealed body, according to claim 1, wherein a closed space surrounded by the first substrate, the second substrate, the glass frit, and the heat generation layer is formed.

3. The method for manufacturing a sealed body, according to claim 1, further comprising the step of forming a light-emitting unit comprising an EL element over a surface of the second substrate between the step of heating the heat generation layer and the step of arranging the first substrate and the second substrate.

4. The method for manufacturing a sealed body, according to claim 1, further comprising the step of forming a color filter over the first substrate between the step of forming the heat generation layer and the step of forming the frit paste.

5. The method for manufacturing a sealed body, according to claim 1, wherein the heat generation layer has a shape of a closed curve.

6. The method for manufacturing a sealed body, according to claim 1, wherein the heat generation layer comprises any one of iron, tungsten, and molybdenum.

7. The method for manufacturing a sealed body, according to claim 1, wherein the frit material comprises one or more compounds selected from magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, and antimony oxide.

8. A method for manufacturing a sealed body, comprising the steps of:
   forming a frit paste comprising a frit material, a binder, and a conductive material over a first substrate;
   heating the frit paste by induction heating to remove the binder and to fuse the frit material so that a glass frit is formed;
   arranging the first substrate and a second substrate to interpose the glass frit therebetween; and
   irradiating the glass frit with laser light to bond the glass frit to the second substrate.

9. The method for manufacturing a sealed body, according to claim 8, wherein a closed space surrounded by the first substrate, the second substrate, and the glass frit is formed.

10. The method for manufacturing a sealed body, according to claim 8, further comprising the step of forming a light-emitting unit comprising an EL element over a surface of the second substrate between the step of heating the frit paste and the step of arranging the first substrate and the second substrate.

11. The method for manufacturing a sealed body, according to claim 8, further comprising the step of forming a color filter over the first substrate before the step of forming the frit paste.

12. The method for manufacturing a sealed body, according to claim 8, wherein the conductive material comprises any one of iron, tungsten, and molybdenum.

13. The method for manufacturing a sealed body, according to claim 8, wherein the conductive material is a powder material.

14. The method for manufacturing a sealed body, according to claim 13, wherein a diameter of the powder material is larger than or equal to 1 nm and smaller than or equal to 100 μm.

15. The method for manufacturing a sealed body, according to claim 8, wherein the frit material comprises one or more compounds selected from magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, and antimony oxide.

16. A method for manufacturing a light-emitting device, comprising the steps of:
   forming a heat generation layer over a first substrate;
   forming a frit paste comprising a frit material and a binder over the heat generation layer;
   heating the heat generation layer by induction heating to remove the binder and to fuse the frit material so that a glass frit is formed;
   forming a sealant over the first substrate;
   arranging the first substrate and a second substrate to interpose the glass frit and the sealant therebetween; and
   irradiating the glass frit with laser light to bond the glass frit to the second substrate.

17. The method for manufacturing a light-emitting device, according to claim 16, wherein a closed space surrounded by the first substrate, the second substrate, the glass frit, and the heat generation layer is formed.

18. The method for manufacturing a light-emitting device, according to claim 16, further comprising the step of forming a light-emitting unit comprising an EL element over a surface of the second substrate between the step of heating the heat generation layer and the step of arranging the first substrate and the second substrate.

19. The method for manufacturing a light-emitting device, according to claim 16, further comprising the step of forming a color filter over the first substrate between the step of forming the heat generation layer and the step of forming the frit paste.

20. The method for manufacturing a light-emitting device, according to claim 16, wherein the heat generation layer has a shape of a closed curve.

21. The method for manufacturing a light-emitting device, according to claim 16, wherein the heat generation layer comprises any one of iron, tungsten, and molybdenum.

22. The method for manufacturing a light-emitting device, according to claim 16, wherein the second substrate is provided with a light-emitting unit.

* * * * *

UNITED STATES PATENT AND TRADEMARK OFFICE
CERTIFICATE OF CORRECTION

PATENT NO. : 8,816,336 B2
APPLICATION NO. : 13/523435
DATED : August 26, 2014
INVENTOR(S) : Akihisa Shimomura It is certified that error appears in the above-identified patent and that said Letters Patent is hereby corrected as shown below:

In the Specification:

Column 1, Line 31; Change "glass fit" to --glass frit--.

Column 1, Line 57; Change "fit material" to --frit material--.

Column 2, Line 40; Change "be, heated" to --be heated--.

Column 4, Line 39; Change "fit material," to --frit material,--.

Column 4, Line 43; Change "fuming" to --forming--.

Column 4, Line 55; Change "glass fit" to --glass frit--.

Column 4, Line 64; Change "filmed" to --formed--.

Column 7, Line 51; Change "foamed" to --formed--.

Column 8, Line 12; Change "glass fit" to --glass frit--.

Column 8, Line 48; Change "fanned" to --formed--.

Column 8, Line 56; Change "fowled" to --formed--.

Column 9, Line 8; Change "atmosphere; the" to --atmosphere, the--.

Column 10, Line 65 to 66; Change "to 100 preferably" to --to 100 μm, preferably--.

Column 11, Line 41; Change "glass fit" to --glass frit--.

Column 13, Line 27; Change "light-emitting. unit" to --light-emitting unit--.

Column 15, Line 44; Change "glass fit" to --glass frit--.

Column 17, Line 19; Change "region. overlapping" to --region overlapping--.

Column 17, Line 19; Change "glass fit" to --glass frit--.

Column 17, Line 20; Change "glass fit" to --glass frit--.

Column 17, Line 22; Change "glass fit" to --glass frit--.

Column 22, Line 47; Change "carbonate), alkaline" to --carbonate), an alkaline--.

Signed and Sealed this
Seventeenth Day of March, 2015

Michelle K. Lee
*Director of the United States Patent and Trademark Office*

CERTIFICATE OF CORRECTION (continued)
U.S. Pat. No. 8,816,336 B2

Column 23, Line 6; Change "faulted" to --formed--.

In the Claims:

Column 26, Line 14, Claim 8; Change "the fit paste" to --the frit paste--.

Column 26, Line 15, Claim 8; Change "the fit material" to --the frit material--.

Column 26, Line 15, Claim 8; Change "glass fit is" to --glass frit is--.